United States Patent [19]
Toprac et al.

[11] Patent Number: 5,926,690
[45] Date of Patent: Jul. 20, 1999

[54] RUN-TO-RUN CONTROL PROCESS FOR CONTROLLING CRITICAL DIMENSIONS

[75] Inventors: Anthony John Toprac; Douglas John Downey, both of Austin, Tex.; Subhash Gupta, San Jose, Calif.

[73] Assignee: Advanced Micro Devices, Inc., Sunnyvale, Calif.

[21] Appl. No.: 08/864,489

[22] Filed: May 28, 1997

Related U.S. Application Data

[51] Int. Cl.$^6$ ............................ G01R 31/26; H01L 21/66
[52] U.S. Cl. .............................................................. 438/17
[58] Field of Search ................................... 438/780, 725, 438/14, 16, 17

[56] References Cited

U.S. PATENT DOCUMENTS

| | | | |
|---|---|---|---|
| 5,629,772 | 5/1997 | Ausschnitt | 356/372 |
| 5,655,110 | 8/1997 | Krivokapic et al. | 395/500 |
| 5,773,174 | 6/1998 | Koizumi et al. | 430/30 |

OTHER PUBLICATIONS

Hankinson et al., "Integrated Real–Time and Run–to–Run Control of Etch Depth in Reactive Ion Etching", Mar. 13, 1996, pp. 1–17.
1995 IEEE/SEMI Advanced Semiconductor Manufacturing Conference—Boning et al., "Practical Issues in Run by Run Process Control", 1995, pp. 201–208.
187th ECS Meeting in Reno, NV—E. Zafiriou et al., "Non-lineal Model Based Run–To–Run Control For Rapid Thermal Processing With Unmeasured Variable Estimation", May 1995.
IEEE/CHMT International Electronics Manufacturing Technology Symposium, Austin, Texas—Boning et al., "Run by Run Control of Chemical–Mechanical Polishing", Oct. 2–4, 1995.
VMIC, Santa Clara, CA—Smith et al., "Compensating for CMP Pad Wear Using Run by Run Feedback Control", Jun. 18–20, 1996.
IEEE Transactions on Semiconductor Manufacturing—Sachs et al., "Process Control System For VLSI Fabrication", Apr. 5, 1990, pp. 1–31.

*Primary Examiner*—Brian Dutton
*Attorney, Agent, or Firm*—Skjerven, Morrill, MacPherson, Franklin & Friel LLP; Ken J. Koestner

[57] ABSTRACT

It has been discovered that all causes of critical dimension variation, both known and unknown, are compensated by adjusting the time of photoresist etch. Accordingly, a control method employs a control system using photoresist etch time as a manipulated variable in either a feedforward or a feedback control configuration to control critical dimension variation during semiconductor fabrication. By controlling critical dimensions through the adjustment of photoresist etch time, many advantages are achieved including a reduced lot-to-lot variation, an increased yield, and increased speed of the fabricated circuits. In one embodiment these advantages are achieved for polysilicon gate critical dimension control in microprocessor circuits. Polysilicon gate linewidth variability is reduced using a control method using either feedforward and feedback or feedback alone. In some embodiments, feedback control is implemented for controlling critical dimensions using photoresist etch time as a manipulated variable. In an alternative embodiment, critical dimensions are controlled using RF power as a manipulated variable. A run-to-run control technique is used to drive the critical dimensions of integrated circuits to a set specification. In a run-to-run control technique a wafer test or measurement is made and a process control recipe is adjusted based on the result of the test or measurement on a run-by-run basis. The run-to-run control technique is applied to drive the critical dimensions of a polysilicon gate structure to a target specification. The run-to-run control technique is applied to drive the critical dimensions in an integrated circuit to a defined specification using photoresist etch time as a manipulated variable.

20 Claims, 2 Drawing Sheets

RUN-TO-RUN CONTROL PROCESS FOR CONTROLLING CRITICAL DIMENSIONS

BACKGROUND OF THE INVENTION

1. Field of the Invention

The present invention relates to semiconductor fabrication methods. More precisely, the present invention relates to a control system used in semiconductor fabrication for controlling feature critical dimensions.

2. Description of the Related Art

Two aspects of feature sizes are controlled in a lithographic and etch process. The first aspect is a critical dimension, the absolute size of a feature, including linewidth, spacing or contact dimensions. The second aspect is the variation in feature size across the wafer surface as measured by steps of a wafer stepper. Linewidth and spacing measurements are regularly performed to determine the actual sizes of critical dimensions at each masking level of a process.

Another aspect of linewidth control is that correct feature sizes are to be maintained across an entire wafer and also maintained from wafer to wafer. As a feature size is reduced, the tolerable error on feature size control is also reduced. When an exposure is performed by a wafer stepper, the feature size is controlled across every exposure field and field-to-field variations are to be held within specified limits.

Linewidth control is affected by many factors including fabrication tools and equipment, process recipes, and raw materials. Critical dimensions are analyzed by measuring fabricated test structures with nominal feature sizes at many positions of a wafer. The measurement results are then plotted as a function of location to determine critical dimension variation.

Linewidth control and control of critical dimensions is largely determined by specific characteristics of the steps of photoresist processing. Photoresist processing typically includes steps of substrate cleaning, dehydration baking and priming, spin coating, soft-baking or pre-baking, exposure, post-exposure treatment, a photoresist develop step, inspection following development, plasma de-scumming, post-baking, etching, deep ultraviolet hardening of photoresist, and stripping of the photoresist. Many of these steps are very important for determining linewidth control and control of critical dimensions. For example, dehydration baking and priming assures adhesion of the photoresist during processing. Poor adhesion can cause a loss of linewidth control including the entire loss of pattern elements in extreme cases.

The coating process including resist formulation, spinner type, wafer size, spin parameters, and ambient temperature during deposition determine the thickness variation across a wafer which, in turn, influences the critical dimensions across the wafer. Contamination with airborne particles and air bubbles can occur during the coating step. The soft-baking step can lead to wafer-to-wafer variations in critical dimensions since, for example, solvent vapors can coat infrared soft-baking lamps changing the energy output.

Exposure of the photoresist is a critical step in the resist processing procedure for several reasons. First, exposure is a step in which wafers are processed individually, leading to possible wafer-to-wafer variations in exposure. Second, the results of the exposure are highly dependent on photoresist thickness so that differences in coating thickness arising in the photoresist coating step are amplified during exposure.

Critical dimensions are conventionally tested by randomly sampling one wafer or a few wafers of a lot or multiple lots of processed wafers on post-develop inspection. If a sampled wafer is found to have critical dimensions that are outside specifications, another sample from the lots of processed wafers may be tested. If the subsequent test results in critical dimensions outside specified values, many wafers may be remeasured. If the critical dimensions are consistently outside the specification limits, the lot or entire group of lots are stripped of photoresist and reprocessed through the photolithography process.

The critical dimensions of polysilicon gates affect many operating parameters of integrated circuits, but fundamentally the greatest considerations of critical dimensions is speed performance and power consumption of a circuit. The smaller this critical dimension, the faster the operation of the transistor and the integrated circuit as a whole. Too small a polysilicon gate critical dimension, however, results in unacceptably high power consumption and parasitic currents in the transistor. An optimal operating point for this critical dimension is therefore defined by these countervailing effects. Thus, the narrower the distribution of critical dimension values centered about the optimal critical dimension in a lot of wafers, the more high speed, functional circuits are produced. Unfortunately, the critical dimensions resulting from conventional manufacturing methods are rarely optimum, resulting in reduced yield of high performance circuits. Furthermore, the conventional process is very wasteful when process conditions are substandard.

What is needed is a technique for reducing polysilicon gate linewidth variability and controlling the process at, or very near, the optimal linewidth value. What is further needed is a technique for reducing lot average critical dimensions in a polysilicon gate etch process without negatively impacting other parameters such as uniformity and line shape.

SUMMARY OF THE INVENTION

It has been discovered that all causes of critical dimension variation, both known and unknown, are compensated by adjusting the time duration of a photoresist etch. Accordingly, a control method employs a control system using photoresist etch time as a controlling variable in either a feedforward or a feedback control configuration to control critical dimension variation during semiconductor fabrication. By controlling critical dimensions through the adjustment of photoresist etch time, many advantages are achieved including a reduced lot-to-lot variation, an increased yield, and increased speed of the fabricated circuits. In one embodiment these advantages are achieved for polysilicon gate critical dimension control in microprocessor circuits.

In accordance with an embodiment of the present invention, polysilicon gate linewidth variability is reduced using a control method using either feedforward or feedback. In some embodiments, feedback control is implemented for controlling critical dimensions using photoresist etch time as a manipulated variable. In an alternative embodiment, critical dimensions are controlled using RF power, gas flow rates, chamber pressure, and/or other recipe variables as manipulated variable(s).

In accordance with an embodiment of the present invention, a run-to-run control technique is used to drive the critical dimensions of integrated circuits to a set specification. In a run-to-run control technique a wafer test or measurement is made and a process control recipe is adjusted based on the result of the test or measurement on a run-by-run basis.

In accordance with a further embodiment of the present invention, the run-to-run control technique is applied to drive the critical dimensions of a polysilicon gate structure to a target specification.

In accordance with a yet further embodiment of the present invention, the run-to-run control technique is applied to drive the critical dimensions in an integrated circuit to a defined specification using photoresist etch time as a manipulated variable.

Many advantages are achieved by the described process control method. One advantage is that the control of critical dimension uniformity is substantially improved by the described process. It is also highly advantageous that the described method improves manufacturability as well as control.

BRIEF DESCRIPTION OF THE DRAWINGS

The features of the described embodiments believed to be novel are specifically set forth in the appended claims. However, embodiments of the invention relating to both structure and method of operation, may best be understood by referring to the following description and accompanying drawings.

DETAILED DESCRIPTION OF THE PREFERRED EMBODIMENTS

Figure 1:
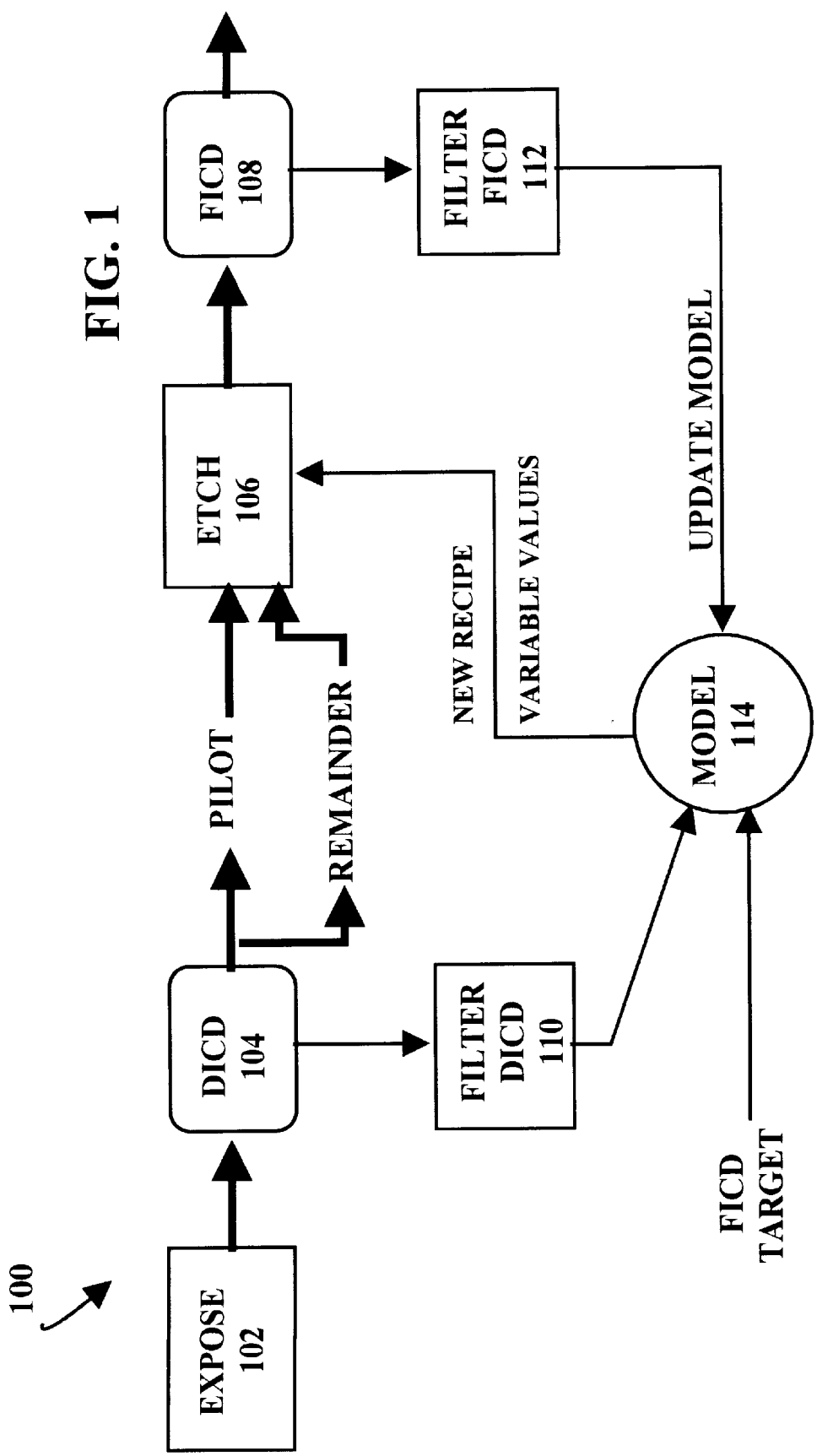
FIG. 1 is a flow chart which illustrates a control method for controlling critical dimensions in a semiconductor fabrication process by adjusting the fabrication parameters or "recipe" for a photoresist etch step in accordance with an embodiment of the present invention.

Referring to FIG. 1, a flow chart illustrates a control method for controlling critical dimensions in a semiconductor fabrication process 100 by adjusting the fabrication parameters or "recipe" for a photoresist etch step 106 previous to a polysilicon gate etch step in the fabrication process 100. In particular, the critical dimensions are controlled using photoresist etch time as a control variable to drive the critical dimensions to a target value.

In overview, the fabrication process 100 involves selection of one or more test wafers, called "pilot" wafers from an entire lot of wafers. The pilot wafers are tested to characterize the lot of wafers, processed through the photoresist etch step 106 using a nominal, average, or moving average processing recipe, and measured in a Final Inspection Critical Dimensions step 108. The results from the pilot lot tests are applied to update a process model 114 which is used to adjust the etch recipe for the remaining wafers in the lot to drive their critical dimensions to the target values. In the illustrative embodiment, scanning electron microscopy (SEM) measurements are made to determine changes in the etch recipe for the remainder of the lot, adjusting the average critical dimension toward a current target critical dimension.

The fabrication process 100 of the illustrative embodiment first under-exposes a wafer 102 to initially produce critical dimensions that are larger than target critical dimension values so that the photoresist etch time is subsequently varied during the photoresist etch step 106 to control driving of the critical dimensions to the target value. In one embodiment, the step of under-exposing the wafer 102 involves exposing the wafer to less energy, typically 5 to 15 milliJoules (mJ) less energy, than is used in the nominal process.

In a Develop Inspection Critical Dimensions (DICD) step 104, the critical dimensions are measured for some of the wafers following the develop step of the photoresist processing procedure. Measurements performed during the Develop Inspection Critical Dimensions (DICD) step 104 are typically inaccurate by nature relative to the Final Inspect Critical Dimension (FICD) measurement. DICD measurements are relatively noisy and often do not reflect important process variations in the photolithography process. In the illustrated method, the Develop Inspection Critical Dimensions step 104 involves measurement of critical dimensions for three "pilot" wafers in a lot of 24 wafers. In other embodiments of the fabrication process 100 more or fewer wafers may be tested to characterize a full lot of wafers. A single wafer may be tested. The greater the number of tested "pilot" wafers, the better the characterization of the lot remainder.

The wafers measured in the Develop Inspection Critical Dimensions step 104 are etched in the photoresist etch step 106 with the etch time set to a nominal photoresist etch time that is based on the initial, average, or moving average operating conditions of the fabrication process 100. The photoresist etch procedure advantageously improves across-wafer uniformity according to FICD measurements, including improvement of the critical dimension ratio for dense and isolated gate structures.

The initial or average operating conditions are set according to the original state of the process model 114. In one embodiment, the nominal etch time is set as an average of the exponentially-weighted moving average of the current photoresist etch times.

Following the photoresist etch step 106, the polysilicon gates are etched, the pilot wafers are stripped and cleaned, and the critical dimensions of the etched wafers are measured in a Final Inspection Critical Dimensions (FICD) step 108. Measurements resulting from the Final Inspection Critical Dimensions (FICD) step 108 more accurately reflect the critical dimensions than DICD measurements generally because the photoresist, which resolves relatively poorly in a scanning electron microscope, is stripped from the wafer for the FICD measurement.

Various measurement techniques may be used for the Develop Inspection Critical Dimensions step 104 and the Final Inspection Critical Dimensions step 108 including scanning electron microscopy (SEM), mechanical measurement techniques, image shearing, and reflectance measurements. Scanning electron microscopy is highly accurate for measuring line widths. A scanning electron microscope uses an electron beam as an illumination source which is scanned over a wafer surface. Impinging electrons from the illumination cause ejection of electrons from the wafer surface. The ejected electrons are collected and translated into a picture of the surface of the wafer on a screen or photograph.

Once the measurements are acquired in the Develop Inspection Critical Dimensions step 104 and the Final Inspection Critical Dimensions step 108, measurement data is added to a database including a DICD database and an FICD database.

Measurements acquired during the Develop Inspection Critical Dimensions step 104 are filtered in a filter DICD step 110 and the filtered measurements are applied to the process model 114 to supply a feed forward control of critical dimensions. Similarly, measurements acquired in the Final Inspection Critical Dimensions step 108 are filtered in a filter FICD step 112 and applied to the process model 114 to supply feedback control of critical dimensions. In some embodiments or some applications, only feedback control of critical dimensions is employed using feedback of the FICD measurements. In other embodiments or other applications, feedforward control of critical dimensions is implemented using feedforward of DICD measurements in conjunction with feedback control from FICD measurements. The filter DICD step 110 and the filter FICD step 112 are used for averaging or smoothing of the data for removal of measurement noise such as random noise and measurement variability. In one embodiment, both the filter DICD step 110 and the filter FICD step 112 are performed using an exponentially-weighted moving average filter.

In the process model 114, the critical dimension measurements for the pilot wafers are used to determine a proper value for the manipulated variable, the photoresist etch time, and applied to the remaining wafers in the lot. The process model 114 determines the extent that the final inspection critical dimensions differ from the FICD target value and changes the photoresist etch time for the remainder of the lot of wafers. In addition, the value of the average etch time may be updated using the updated or changed new value of etch time. The process model 114 is updated to establish a quantitative relationship between the manipulated variable, photoresist etch time in the illustrative embodiment, and the etched polysilicon gate critical dimensions. The process model 114 is updated by adjusting one or more model parameters such that the latest value of photoresist etch time, when input to the model, gives a model prediction for FICD value which is the same as the measured FICD value resulting from the given photoresist etch time. The measurements acquired during the Develop Inspection Critical Dimensions step 104 are typically not sufficiently accurate and reliable for sole usage in controlling the fabrication process 100 although the measurements are useful for predictive modeling at the early stages of the process model 114.

Figure 2:
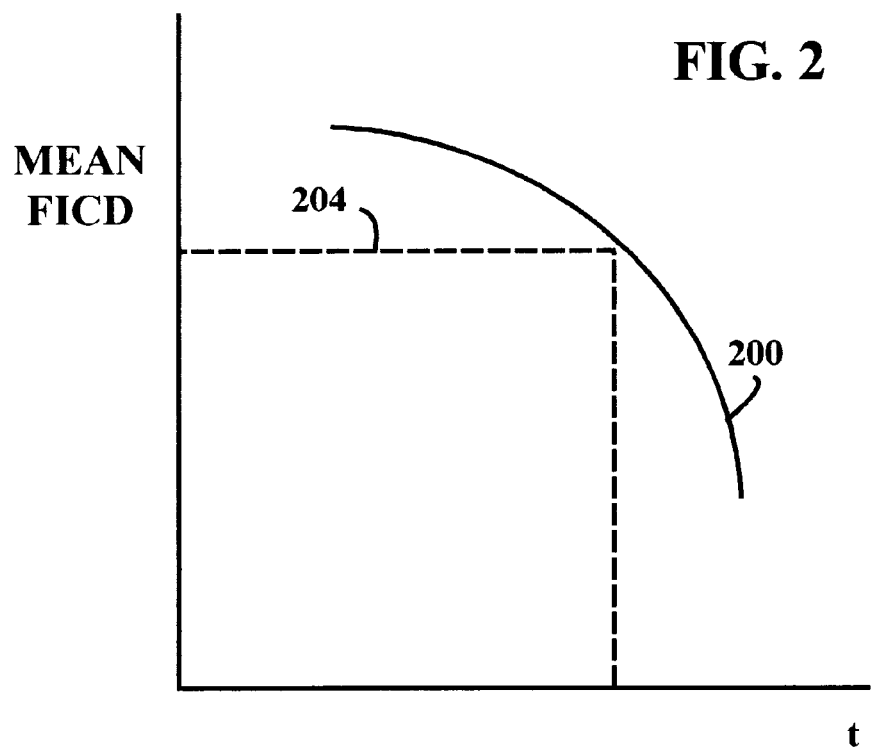
FIG. 2 is a graph showing the relationship of final inspection critical dimensions to photoresist etch time for developing a process model of the control method depicted in FIG. 1.

The operation of the process model 114 is shown graphically in FIG. 2 as a relation 200 of final inspection critical dimensions with respect to photoresist etch times. The process model 114 receives measurement data resulting from the pilot test wafers. In the illustrative embodiment, three wafers are included in the set of pilot test wafers. The model relation is updated and centered based on the measurement results so that the updated model reflects the current wafer conditions and the current state of the etcher. The updated model is then used to adjust the etch recipe for the remaining wafers in the lot to improve control of critical dimensions. The improvement is attained through better centering of the FICD mean 204 for each lot at the target critical dimension. The improvement is further attained by decreasing or eliminating variability in the FICD results that are caused by variations in raw materials entered into the fabrication process 100.

In the illustrated embodiment, the process model 114 is updated using the measurement of final inspection critical dimensions and the photoresist etch time used for the pilot test wafers. The updated model is used to predict an effective photoresist etch time to improve critical dimensions for the remaining 21 wafers of the 24 wafer lot. Following etching of all wafers in a lot, the Final Inspection Critical Dimensions step 108 measures the critical dimensions of the remaining wafers in the lot and the process model 114 is updated according to the measurements of the remaining wafers. If a plurality of wafer lot runs are processed, the process model 114 may be continually updated for the series of runs depending on the results of the tests. For example, the fabrication process 100 may be controlled so that the model is either updated or unchanged between runs. Furthermore, the manipulated variable may be set by external adjustment.

In one embodiment, the process model 114 uses a quadratic relationship between the critical dimensions and the photoresist etch time. A polynomial function for the critical dimensions is shown in equation (3), as follows:

$$FICD = at^2 + bt + c, \tag{3}$$

which may be solved by iterative methods or by using the quadratic formula, shown in equation (4) as follows:

$$t = \frac{-b + \sqrt{b^2 - 4ac}}{2a}. \tag{4}$$

The quadratic relationship is used for modeling various physical phenomena, reverting to a linear relationship for lateral etches and remaining in a quadratic form for isotropic vertical etches. In this embodiment, the c parameter in the quadratic relationship is used to center the relationship between the final inspection critical dimensions and the photoresist etch times. By setting the c parameter, the process model 114 sets the model through a current average operating point which is indicative of the characteristics of the wafers, the etch chamber, and the process in general. Once the current average operating point of the process is set, the model presumably reflects the actual current state of the process, wafers and chamber so that any difference between the final inspection critical dimensions and the target FICD values reflects the amount of time the photoresist etch time is to be changed to drive measured FICDs to the target value.

In some embodiments, the c parameter is derived from the DICD measurement which is supplied using feedforward control of the process model 114. The c parameter is used in this manner as an adjustable constant. In some embodiments, the value of c used to update the model is the value of c determined as described above and then averaged or filtered using the exponentially weighted moving average or other filtering method to "smooth" variations in the c parameter.

Figure 3:
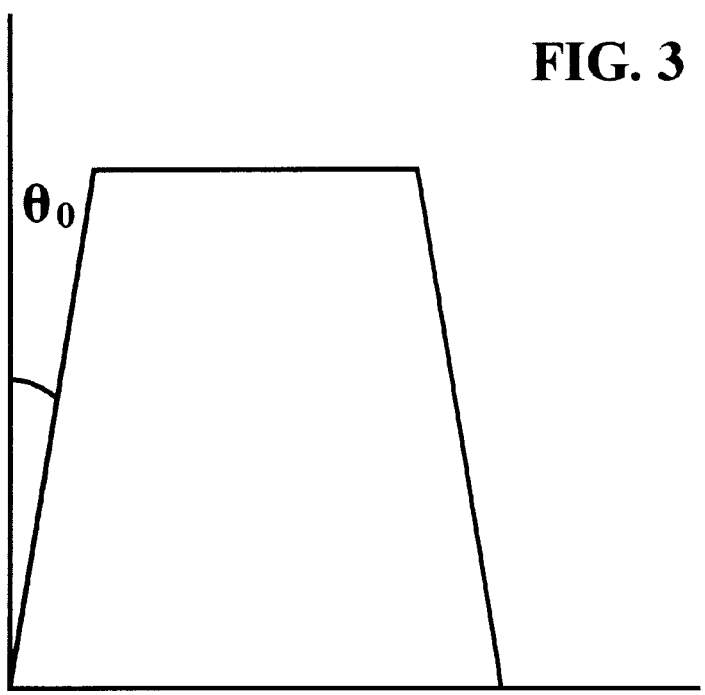
FIG. 3 is a cross-sectional view of the photoresist line used to create a polysilicon gate structure which is useful for illustrating the quantitative analysis for implementing a process model in accordance with an embodiment of the present invention.

In an alternative embodiment, the process model 114 is developed based on the sidewall angle of photoresist lines, which is depicted in a cross-sectional view in FIG. 3. In the alternative process model 114 the difference between the Develop Inspection Critical Dimensions step 104 and the Final Inspection Critical Dimensions step 108 is developed, shown in equation (5) as follows:

$$DICD - FICD = CB + (2*ER*ET*\tan(k*ET + \Theta_0)). \tag{5}$$

where DICD is the develop inspection critical dimensions, FICD is the final inspection critical dimensions, CB is the chamber bias, ER is the etch rate, ET is the etch time, and $\Theta_0$ is the initial sidewall angle of the photoresist. The initial sidewall angle of the photoresist $\Theta_0$ may be a measured parameter. The relationship shown in equation (5) reduces to the quadratic form or equation (3) to attain a very good approximation for small angles $\Theta$ such that tan $\Theta$ is approximately equal to Θ. Preliminary studies have shown that usage of the polynomial function as shown in equations (3) and (4) produces a more stable model than usage of a function according to equation (5).

The fabrication process 100 uses feedback control of the process recipe using run-by-run control to control critical dimensions. In particular, photoresist etch time is varied depending on the measurement of wafers which were previously processed. In an alternative embodiment, critical dimensions are controlled using radio frequency power as a control variable. Generally, embodiments using photoresist etch time as the control variable advantageously provide more stable control of critical dimensions without unwanted process side-effects.

In an alternative embodiment, a plurality of pilot wafers are tested with each pilot wafer representing a "split" of wafers. In one example, a lot of 24 wafers is divided into three splits with each split containing eight wafers. One pilot wafer is assigned for each of the three splits. In the step of under-exposing the wafer 102, the splits are processed separately using a different exposure energy to produce three levels of DICD measurements. The range of DICD measurements is determined based on the range of acceptable values of the manipulated variables, for example the photoresist etch times, and constraints of the process model 114.

While the invention has been described with reference to various embodiments, it will be understood that these embodiments are illustrative and that the scope of the invention is not limited to them. Many variations, modifications, additions and improvements of the embodiments described are possible. In various embodiments of the critical dimension control procedure, the method may be practiced in a manual or automatic form. For example, a software system may be used to automate the entire critical dimension control loop.

In an alternative implementation of a critical dimension control procedure, a Bottom Anti-Reflective Coating (BARC) etch step is implemented prior to etching of polysilicon or other substrates. The BARC process is used to improve a photolithography process by reducing the stray light photoresist exposure from reflections off a substrate, such as polysilicon. A BARC process involves the formation of an anti-reflective coating beneath the photoresist layer but overlying the polysilicon layer. The BARC layer is etched before the polysilicon is exposed for etching.

In an embodiment of a critical dimension control procedure for an implementation of the photoresist processing procedure using a BARC etch step, the BARC etch time may be used as a control variable for controlling critical dimensions, rather than usage of photoresist etch time as the control variable.

What is claimed is:

1. A method of fabricating an integrated circuit comprising:
    pattern, expose, and develop a photoresist layer on a wafer in a photolithography process that forms a plurality of structures on the integrated circuit including a gate;
    measuring a DICD critical dimension of the gate following developing of the photoresist layer in a Develop Inspection Critical Dimensions (DICD) operation;
    etching the wafer including etching of the gate;
    measuring a FICD critical dimension of the gate following etching of the wafer in a Final Inspection Critical Dimensions (FICD) operation;
    feeding forward the DICD critical dimension to a process model;
    feeding back the FICD critical dimension to the process model; and
    controlling a photoresist deposit and etch process recipe parameter in the process model according to the DICD critical dimension and the FICD critical dimension of the gate to improve critical dimension uniformity.

2. A method according to claim 1 wherein:
    the gate is a polysilicon gate.

3. A method according to claim 1 further comprising:
    initially underexposing the wafer to initially produce DICD and FICD critical dimensions that are larger than target critical dimension values.

4. A method according to claim 3 further comprising:
    subsequent to initially underexposing the wafer, varying photoresist etch time to control driving of the FICD critical dimensions to the target critical dimension values.

5. A method according to claim 4 further comprising:
    etching the wafer using an etch time set to a nominal photoresist etch time that is based on the initial, average, or moving average operating conditions of the fabrication method.

6. A method according to claim 1 wherein:
    the DICD critical dimension measurement and the FICD critical dimension measurement are measured using a measurement technique selected from among scanning electron microscopy (SEM), mechanical measurement techniques, image shearing, and reflectance measurements.

7. A method according to claim 1 further comprising:
    storing the DICD critical dimension measurement and the FICD critical dimension measurement in a database.

8. A method according to claim 1 further comprising:
    filtering the DICD critical dimension measurement to supply a filtered feed-forward control of critical dimensions to the process model.

9. A method according to claim 1 further comprising:
    filtering the FICD critical dimension measurement to supply a filtered feed-back control of critical dimensions to the process model.

10. A method according to claim 1 further comprising:
    controlling the photoresist deposit and etch process recipe parameter in the process model according to a quadratic relationship between the DICD and the FICD critical dimensions and photoresist etch time.

11. A method according to claim 1 further comprising:
    controlling the photoresist deposit and etch process recipe parameter in the process model according to a quadratic relationship between the DICD and the FICD critical dimensions and photoresist etch time as follows:

$$FICD = at^2 + bt + c,$$

which is solved using the quadratic formula, as follows:

$$t = \frac{-b + \sqrt{b^2 - 4ac}}{2a},$$

in which parameter c sets a current average operating point.

12. A method according to claim 1 further comprising
    controlling the photoresist deposit and etch process recipe parameter in the process model according to a relationship between the difference of the DICD and the FICD critical dimensions and photoresist etch time as follows:

$$\text{DICD}-\text{FICD}=\text{CB}+(2*\text{ER}*\text{E}*\tan(k*\text{ET}+\Theta_0)),$$

in which CB is a chamber bias parameter, ER is etch rate, ET is etch time, and $\Theta_0$ is initial sidewall angle of the photoresist.

13. A method according to claim 1 further comprising:

performing a run-to-run control technique to drive the DICD and the FICD critical dimensions of a polysilicon gate structure to a target specification.

14. A method according to claim 1 further comprising:

exposing the photoresist at a selected radio frequency (RF) power; and selecting the selected RF power as the selected photoresist deposit and etch process recipe parameter for controlling the DICD and FICD critical dimensions.

15. A method according to claim 1 wherein:

the photoresist deposit and etch process recipe parameter for controlling the DICD and the FICD critical dimensions is etch time.

16. A method according to claim 1 further comprising:

forming a polysilicon layer overlying a substrate;

depositing a photoresist layer on the polysilicon layer;

etching the deposited photoresist layer for a controlled photoresist etch time; and etching the polysilicon layer subsequent to the step of etching the deposited photoresist layer.

17. A method according to claim 1 further comprising:

forming an anti-reflective coating beneath the photoresist layer using a Bottom Anti-Reflective Coating (BARC) etch step to reduce stray light photoresist exposure from reflections off a substrate.

18. A method of fabricating an integrated circuit comprising:

pattern, expose, and develop a photoresist layer on a plurality of wafers in a photolithography process that forms a plurality of structures on the integrated circuit including a gate;

measuring a DICD critical dimension of the gate in a pilot subset of the plurality of wafers following developing of the photoresist layer in a Develop Inspection Critical Dimensions (DICD) operation;

etching wafers of the plurality of wafers remaining after removal of the pilot subset, the etching including etching of the gate;

measuring a FICD critical dimension of the gate following etching of the plurality of wafers remaining after removal of the pilot subset in a Final Inspection Critical Dimensions (FICD) operation;

feeding forward the DICD critical dimension to a process model;

feeding back the FICD critical dimension to the process model; and controlling a photoresist deposit and etch process recipe parameter in the process model according to the DICD critical dimension and the FICD critical dimension of the gate to improve critical dimension uniformity.

19. A method according to claim 18 further comprising:

dividing the plurality of wafers into two or more split subsets of wafers; and processing the split subsets separately using different exposure levels to produce a respective two or more levels of DICD critical dimension measurements.

20. A method according to claim 18 wherein:

the photoresist deposit and etch process recipe parameter for controlling the DICD and the FICD critical dimensions is etch time.

* * * * *